United States Patent [19]

Tukazaki et al.

[11] Patent Number: 4,625,322

[45] Date of Patent: Nov. 25, 1986

[54] CHARGE COUPLED DEVICE PROVIDED WITH AUTOMATIC BIAS-VOLTAGE SETTING MEANS

[75] Inventors: Hisanobu Tukazaki, Yokohama; Kazuo Kondo; Syuzo Matsumoto, both of Fujisawa, all of Japan

[73] Assignee: Hitachi, Ltd., Tokyo, Japan

[21] Appl. No.: 672,369

[22] Filed: Nov. 16, 1984

[30] Foreign Application Priority Data

Nov. 18, 1983 [JP] Japan ................................. 58-216241
Dec. 5, 1983 [JP] Japan ................................. 58-228421

[51] Int. Cl.⁴ ........................................... H01L 29/76
[52] U.S. Cl. ..................................... 377/58; 307/297; 307/353; 357/24; 377/59; 377/63
[58] Field of Search ............... 307/491, 494, 353, 297, 307/296 R; 357/24 R, 24 M; 377/58-60, 63

[56] References Cited

U.S. PATENT DOCUMENTS

| | | | |
|---|---|---|---|
| 4,156,818 | 5/1979 | Collins et al. | 307/353 X |
| 4,223,234 | 9/1980 | Levine | 357/24 X |
| 4,255,673 | 3/1981 | Knauer | 377/58 |
| 4,412,343 | 10/1983 | Kosonocky | 377/58 |
| 4,454,435 | 6/1984 | Burns | 307/353 X |
| 4,521,896 | 6/1985 | Borsuk et al. | 357/24 X |
| 4,556,851 | 12/1985 | Levine | 377/60 X |
| 4,573,177 | 2/1986 | Petrosky | 307/296 R X |
| 4,574,384 | 3/1986 | Murata et al. | 377/60 X |

OTHER PUBLICATIONS

Chai et al. "Noise Compensator for Charge-Coupled Devices", *IBM T.D.B.*, vol. 16, No. 4, 9-1973.

*Primary Examiner*—Stanley D. Miller
*Assistant Examiner*—D. R. Hudspeth
*Attorney, Agent, or Firm*—Antonelli, Terry & Wands

[57] ABSTRACT

A bias voltage setting circuit for a main charge coupled device is disclosed in which first and second auxiliary charge coupled devices are formed on a semiconductor substrate together with the main charge coupled device, a reference voltage is generated by the first auxiliary charge coupled device, the output voltage of the second auxiliary charge coupled device is compared with the reference voltage by means of a comparator, the bias voltage applied to the second auxiliary charge coupled device is automatically changed by a feedback circuit so that the output voltage of the second auxiliary charge coupled device is approximately equal to the reference voltage, and the bias voltage applied to the second auxiliary charge coupled device is also used as the bias voltage applied to the main charge coupled device.

6 Claims, 13 Drawing Figures

CHARGE COUPLED DEVICE PROVIDED WITH AUTOMATIC BIAS-VOLTAGE SETTING MEANS

BACKGROUND OF THE INVENTION

The present invention relates to a charge coupled device (hereinafter referred to as "CCD"), and more particularly to a CCD provided with means for automatically setting the bias voltage of the CCD.

In a CCD, electric charge corresponding to an A.C. signal applied to the input electrode of the CCD and electric charge corresponding to a D.C. bias voltage are transferred from an input part to an output part. In order to transfer the electric charge corresponding to the A.C. signal without any distortion, it is required to set the D.C. bias voltage to an appropriate value.

FIG. 1 shows the cross section of an input part of a CCD and an inner potential which appears under each gate electrode at an operation period, and FIG. 2 shows the waveforms of pulse signals for driving a CCD. It is to be noted that the inner potential shown in FIG. 1 is that for an electron and the inner potential for a positive charge becomes high as the distance from the axis of abscissa in a direction toward the lower side of FIG. 1 is larger.

A buried channel CCD having two-layer gate electrodes and driven by a two-phase pulse signal is shown in FIG. 1, by way of example, and an input signal is supplied to the CCD by the diode cutoff method. The structure of the CCD shown in FIG. 1 will first be explained. On a P-type semiconductor substrate 1, there are formed a highly-doped N-type diffusion layer 2, an N-type buried layer 3, and low-doped N-type buried layers 4, 5, 6 and 7 which are produced by doping the N-type buried layer 3 with a P-type impurity. Further, in FIG. 1, reference numerals 8 through 15 designate gate electrodes, and 16 through 19 input terminals each receiving a driving pulse signal.

When a gate voltage is applied to the terminals 17, 18 and 19, the inner potential appearing under the gate electrodes 10, 12 and 14 corresponding to the low-doped buried layers 5, 6 and 7 is higher than the inner potential appearing under the gate electrodes 11, 13 and 15 which do not have such a low-doped buried layer thereunder. For instance, when the inner potential appearing under the gate electrode 10 is compared with the inner potential appearing under the gate electrode 11, the former is higher than the latter. The higher inner potential acts as a potential barrier for a transferred charge, and prevents the charge from flowing backward.

A sampling pulse signal $P_S$ (shown in FIG. 2) is applied to the gate electrode 8 through the terminal 16, and the gate electrode 9 is applied with a D.C. voltage from a constant voltage source 21. A driving pulse signal $P_1$ (shown in FIG. 2) is applied to the gate electrodes 10 and 11 through the terminal 17, and applied to the gate electrodes 14 and 15 through the terminal 19. Further, a driving pulse signal $P_2$ (shown in FIG. 2) is applied to the gate electrodes 12 and 13 through the terminal 18. A D.C. bias voltage is supplied from a constant voltage source 20 to the N-type diffusion layer 2 through a resistor 23. A signal which is to be delayed, is supplied from a signal source 22 to the N-type diffusion layer 2 through a coupling capacitor 24.

The output voltages of the constant voltage sources 20 and 21 are well regulated and have appropriate values. Now, let us consider the operation of the input part shown in FIG. 1. At a time $t=t_1$ the sampling pulse signal $P_S$ takes a high level (as shown in FIG. 2), and a potential well $W_8$ formed under the gate electrode 8 becomes large in depth. A potential well $W_9$ formed under the gate electrode 9 and the potential $W_8$ are filled with electric charge which is supplied from the N-type diffusion layer 2, to the potential $V_{S1}$ of the N-type diffusion layer 2. At this time, the driving pulse signal $P_1$ takes a low level, as shown in FIG. 2. Accordingly, a potential well $W_{10}$ formed under the gate electrode 10 is small in depth, and the potential of the well $W_{10}$ acts as a potential barrier for the electric charge which is supplied to the potential well $W_9$. At a time $t=t_2$, the sampling pulse signal $P_S$ takes a low level, and the potential well $W_8$ existing under the gate electrode 8 becomes shallow. Thus, the potential well $W_9$ existing under the gate electrode 9 is separated from the N-type diffusion layer 2, which is the charge supply source. An electric charge $Q_{in}$ which is stored under the gate electrode 9 at this time, is approximately proportional to a difference between an inner potential $\phi_R$ appearing under the gate electrode 9 and the potential $V_{S1}$ of the N-type diffusion layer 2, that is, $Q_{in}=K(\phi_R-V_{S1})$, where K is a constant dependent upon the area of the gate electrode 9, and others.

At a time $t=t_3$, the driving pulse signal $P_1$ takes a high level and the driving pulse signal $P_2$ takes a low level, as shown in FIG. 2. Thus, the electric charge existing under the gate electrode 9 is transferred to a potential well $W_{11}$ which is formed under the gate electrode 11. At a time $t=t_5$, the levels of the driving pulse signals $P_1$ and $P_2$ are reversed, and thus the electric charge existing under the gate electrode 11 is transferred to a potential well $W_{13}$ which is formed under the gate electrode 13.

Thereafter, each time the levels of the driving pulse signals $P_1$ and $P_2$ are reversed, the electric charge is transferred to the next potential well. The above-mentioned potential $V_{S1}$ is the sum of the potential $V_{DC}$ of the constant voltage source 20 and the A.C. signal f(t) from the signal source 22. Accordingly, the electric charge $Q_{in}$ supplied from the N-type diffusion layer 2 is expressed by the following equation:

$$Q_{in}=K(\phi_R-V_{DC})-Kf(t) \qquad (1)$$

That is, the charge $Q_{in}$ can be expressed by the sum of the charge Kf(t) proportional to the A.C. signal and the D.C. charge $K(\phi_R-V_{DC})$.

Next, the operation of an output part of a CCD will be explained below. FIG. 3 shows the cross section of an output part of a CCD whose output is amplified by using a floating diffusion layer, and shows an inner potential which appears under each gate electrode at an operation period. The structure of the output part shown in FIG. 3 will first be explained. Referring to FIG. 3, an N-type diffusion layer 69 acts as a drain for electric charge transferred from an input part. At a floating diffusion layer 70 of N-type, the electric charge transferred from the input part is converted into a voltage by means of the junction capacitance between the diffusion layer 70 and a P-type substrate 71. Buried layers 72 and 73 are similar to the N-type buried layer 3 shown in FIG. 1, and buried layers 74, 75 and 76 are similar to the low-doped N-type buried layers 4, 5, 6 and 7 shown in FIG. 1. Further, in FIG. 3, reference numerals 77 through 82 designate gate electrodes, and 83 through 85 input terminals each receiving a driving pulse signal. The driving pulse signal $P_2$ (shown in FIG. 2) is applied to the gate electrodes 77 and 78 through the terminal 83, and the driving pulse signal $P_1$ (shown in FIG. 2) is applied to the gate electrodes 79 and 80 through the terminal 84. An appropriate D.C. voltage from a constant voltage source 86 is supplied to the gate electrode 81, and a reset pulse signal $P_R$ (shown in FIG. 2) is applied to the gate electrode 82 through the terminal 85. The N-type diffusion layer 69 is connected to a constant voltage source 87, and the floating diffusion layer 70 is connected to a circuit which includes constant current sources 89 and 92, NMOS transistors 88 and 91, a samplehold circuit 90, and an output terminal 93.

Now, let us consider the operation of the output part shown in FIG. 3. At the time $t=t_3$, the driving pulse signal $P_1$ takes the high level, and thus a potential well $W_{80}$ formed under the gate electrode 80 stores the electric charge transferred from a potential well $W_{78}$, which is formed under the gate electrode 78. At this time, the reset pulse signal $P_R$ takes a high level as shown in FIG. 2, and therefore an inner potential appearing under the gate electrode 82 is lowered. Thus, the floating diffusion layer 70 communicates with the diffusion layer 69, and the potential of the floating diffusion layer 70 is made equal to the potential of the diffusion layer 69, that is, a potential determined by the constant voltage source 87. Such an operation is called a reset operation. At a time $t=t_4$, the reset pulse signal takes a low level, and thus the floating diffusion layer 70 is insulated (or isolated) from the diffusion layer 69. At a time $t=t_6$, the levels of the driving pulse signals $P_1$ and $P_2$ are reversed, and the electric charge existing under the gate electrode 80 is transferred to the floating diffusion layer 70. When the transferred charge is expressed by $Q_{SIG}$ and the junction capacitance between the floating diffusion layer 70 and substrate 71 by C, a voltage change $\Delta V$ appearing at the floating diffusion layer 70 is given by the following equation:

$$\Delta V = \frac{Q_{SIG}}{C}$$

At a time $t=t_7$, the levels of the driving pulse signals $P_1$ and $P_2$ are again reversed, and thus the next charge is stored in the potential well $W_{80}$ which is formed under the gate electrode 80. Thereafter, the operation in a period from $t_3$ to $t_7$ is repeated. Accordingly, a voltage waveform appearing at the floating diffusion layer 70 is a comb-shaped waveform having the same period as the driving pulse signals, as shown in FIG. 4A. The reference value $E_o$ of this voltage waveform is made equal to the output voltage of the constant voltage source 87 by the previously-mentioned reset operation. The voltage change $\Delta V$ appearing at the floating diffusion layer 70 takes negative values since the transferred charge in the present case is an electron, and the height of the envelope of the voltage waveform is proportional to the signal charge (that is, the electric charge which is injected into the CCD in accordance with the A.C. input signal). In other words, an envelope $E_1$ shown in FIG. 4A indicates the waveform of the A.C. signal which is to be delayed. The signal shown in FIG. 4A is applied to the sample-hold circuit 90 through a source follower which is made up of the NMOS transistor 88 and constant current source 89. A signal waveform $E_2$ shown in FIG. 4B is sent from the sample-hold circuit 90 to the output terminal 93 through a source follower which made up of the NMOS transistor 91 and constant current source 92. The output signal from the terminal 93 is sent to a low pass filter (not shown), to remove a high frequency component from the output signal, thereby obtaining a signal waveform $E_3$ shown in FIG. 4C.

Next, the maximum transferable electric charge will be explained below. Referring to the inner potential distribution at the time $t=t_3$ (shown in FIG. 1), a potential difference $\Delta\phi_{TS}$ between the inner potential appearing under the gate electrode 10 and the inner potential appearing under the gate electrode 11 is determined by the impurity concentration of the N-type buried layer 3 and the impurity concentration of the low-doped N-type buried layers 4, 5, 6 and 7. If electric charge is supplied to the potential well $W_{11}$ (which is formed under the gate electrode 11) to such an extent as to exceed the potential difference $\Delta\phi_{TS}$, part of the electric charge will flow back to the potential well $W_9$ (which is formed under the gate electrode 9) when the inner potential distribution at the time $t=t_3$ is changed to the inner potential distribution at the time $t=t_5$ (shown in FIG. 1). Accordingly, the electric charge which can be transferred between potential wells when the levels of the driving pulse signals $P_1$ and $P_2$ are reversed, is proportional to the potential difference $\Delta\phi_{TS}$. That is, the maximum transferable electric charge $Q_{MAX}$ is equal to $K\Delta\phi_{TS}$. Since $\leq 0 \leq Q_{in} Q_{MAX}$, the following formula is obtained:

$$0 \leq \{K(\phi_R - V_{DC}) - Kf(t)\} \leq K\Delta\phi_{TS} \qquad (b\ 2)$$

When the signal f(t) from the signal source 22 is given by $A \sin \omega t$, the formula (2) is rewritten as follows:

$$0 \leq (\phi_R - V_{DC} - A\sin \omega t) \leq \Delta\phi_{TS} \qquad (3)$$

The maximum amplitude $A_{MAX}$ of the above signal is obtained when the potential difference $(\phi_R - V_{DC})$ is equal to one-half the potential difference $\Delta\phi_{TS}$, that is, when the following equation holds:

$$(\phi_R - V_{DC}) = \tfrac{1}{2}\Delta\phi_{TS} \qquad (4)$$

At this time, the maximum amplitude $A_{MAX}$ is given by the following equation:

$$A_{MAX} = \tfrac{1}{2}\Delta\phi_{TS} \qquad (5)$$

Accordingly, the output voltages of the constant voltages sources 20 and 21 are selected so as to satisfy the equation (4).

The voltage $V_{DC}$ is dependent on the constant voltage source 20, and the potential $\phi_R$ is dependent on the constant voltage source 21, the impurity concentration of the N-type buried layer 3, the thickness of an insulating oxide film formed between the gate electrode 9 and the semiconductor substrate, and others. Further, the potential difference $\Delta\phi_{TS}$ is dependent on the impurity concentration of the N-type buried layer 3, the impurity concentration of the low-doped N-type diffusion layers 4, 5, 6 and 7, and others. That is, the parameters $V_{DC}$, $\phi_R$ and $\Delta\phi_{TS}$ vary independently of each other, and therefore the characteristics of CCD vary widely. Accordingly, it is required to adjust the output voltage $V_{DC}$ of the constant voltage source 20 without fail.

In general, a signal having a sinusoidal waveform and a single frequency is applied to the highly-doped N-type diffusion layer 2, and the voltage $V_{DC}$ is adjusted so that the harmonic distortion of output is made as small as possible. The voltage $V_{DC}$ is adjusted manually or automatically by means of a special adjusting tool (method). Thus, the manufacturing cost of CCD is raised. Further, as mentioned above, the parameters $V_{DC}$, $\phi_R$ and $\Delta\phi_{TS}$ vary independently of each other. Accordingly, it is very difficult to design a temperature compensation circuit for a CCD.

SUMMARY OF THE INVENTION

An object of the present invention is to provide a CCD equipped with automatic bias-voltage setting means which eliminates the need of the D.C. bias voltage adjustment at an input part of the CCD and can always supply an appropriate D.C. bias voltage to the input part.

A gist of the present invention will be explained below, with reference to FIG. 5. FIG. 5 shows a relationship between the input voltage $V_{DC}$ to a CCD and the quantity of transferred charge. As shown in FIG. 5, a maximum quantity of electric charge $Q_{MAX}$ can be transferred as long as the input voltage $V_{DC}$ lies in a range less than a value $V_{INL}$. When the input voltage $V_{DC}$ lies in a range from the value $V_{INL}$ to a value $V_{INH}$, an electric charge corresponding to the input voltage $V_{DC}$ is transferred, that is, the input voltage $V_{DC}$ is converted into the electric charge which decreases linearly with the increase of input voltage $V_{DC}$. The voltage range from the value $V_{INL}$ to the value $V_{INH}$ is the so-called dynamic range. When the input voltage $V_{DC}$ lies in a range exceeding the value $V_{INH}$, an electric charge $Q_{MIN}$ is transferred which is generated by noise and is approximately equal to zero.

The ranges of input voltage corresponding to $Q_{MAX}$ or $Q_{MIN}$ are far greater than a change in input voltage caused by variations in temperature and process. Accordingly, it is easy to set the input voltage so that the transferred electric charge is equal to $Q_{MAX}$ or $Q_{MIN}$. Accordingly, a CCD having first and second input parts can be readily formed in which the bias voltage of the first input part is set so that an electric charge of $Q_{MAX}$ is injected into the first input part, the bias voltage of the second input part is set so that an electric charge of $Q_{MIN}$ is generated in the second input part, and the electric charge of $Q_{MAX}$ transferred from the first input part and the electric charge of $Q_{MIN}$ transferred from the second input part are summed up and then halved to detect an electric charge of $Q_{MAX}/2$ corresponding to an approximate center $V_{INM}$ of the dynamic range.

As mentioned previously, the electric charge $Q_{MIN}$ is approximatley equal to zero, and therefore the electric charge equal to $Q_{MAX}/2$ can be detected even when the second input part and summation part are omitted. Alternatively, the electric charge equal to $Q_{MAX}/2$ can be detected in the following manner. The maximum transferable electric charge $Q_{MAX}$ of a CCD is approximately proportional to the area of a gate electrode. Accordingly, if a CCD in which the gate electrode on the input side is half layer in area than the other standard size gate electrode including output side gate electrode, is operated with an input voltage less than the value $V_{INL}$, the electric charge equal to $Q_{MAX}/2$ will be detected.

According to one aspect of the present invention, a first auxiliary CCD for transferring an electric charge corresponding to the center value $V_{INM}$ of the dynamic range and a second auxiliary CCD having substantially the same characteristics as a main CCD are provided in addition to the main CCD, the outputs of the auxiliary CCD's are compared with each other by means of a comparator, the bias voltage $V_{DC}$ applied to the input electrode of the second auxiliary CCD is set so that the above outputs are equal to each other, that is, the bias voltage $V_{DC}$ of the second auxiliary CCD is automatically adjusted so that the potential difference $(\phi_R - V_{DC})$ becomes equal to the approximate center $V_{INM}$ of the dynamic range, and the bias voltage $V_{DC}$ thus adjusted is also used as the bias voltage of the main CCD (for delaying a signal), to automatically put the main CCD in an optimum bias state.

Further, when a first auxiliary CCD for transferring an electric charge equal to $1/n$ of the maximum transferable electric charge $Q_{MAX}$ is used and the value of n is appreriately selected, the bias voltage of a main CCD can be varied in accordance with the value of n.

According to another aspect of the present invention, a first auxiliary CCD for transferring an electric charge equal to $Q_{MAX}/n$ is used, and the bias voltage of a main CCD is determined on the basis of the output of the first auxiliary CCD.

DESCRIPTION OF THE PREFERRED EMBODIMENTS

Now, explanation will be made on embodiments of a CCD according to the present invention, with reference to the drawings.

Figure 1:
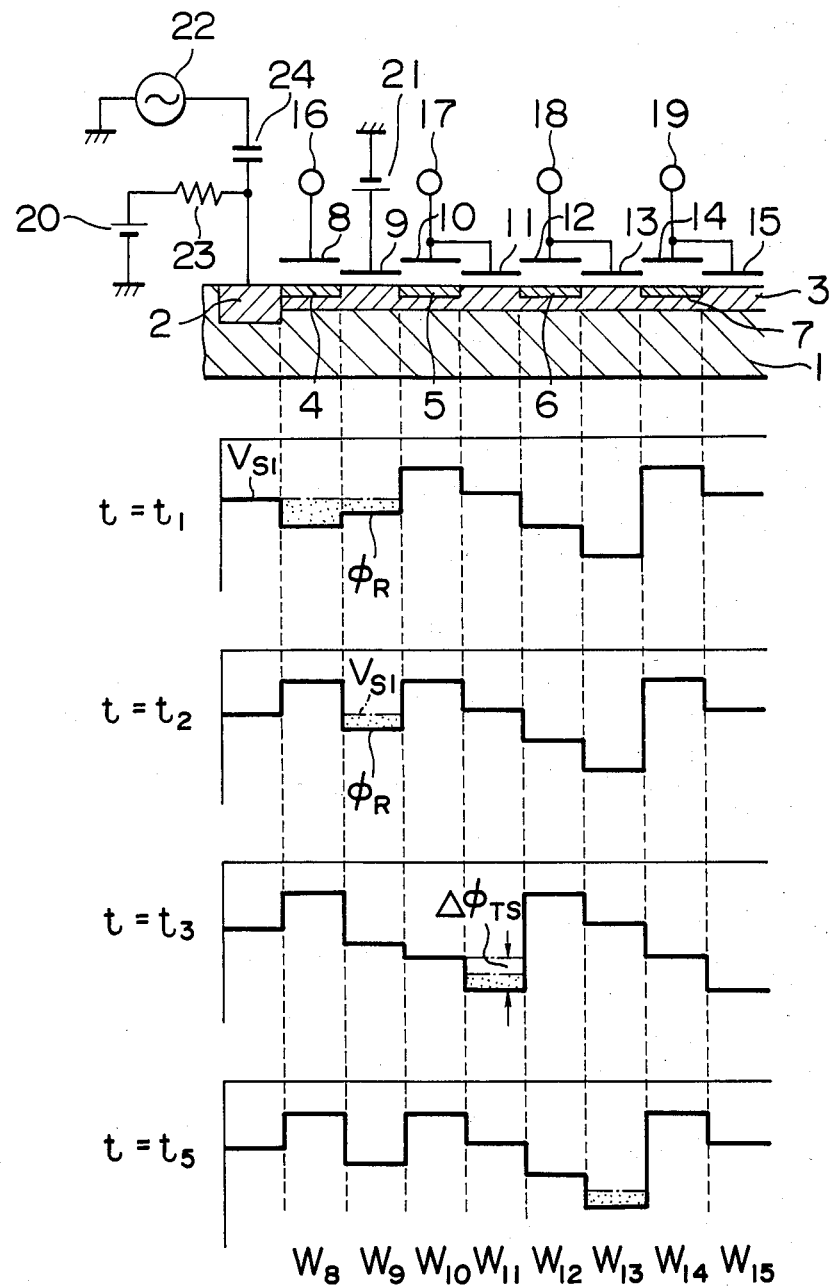
FIG. 1 shows the cross section of an input part of a CCD and the inner potential distribution in the input part at an operation period.
Figure 2:
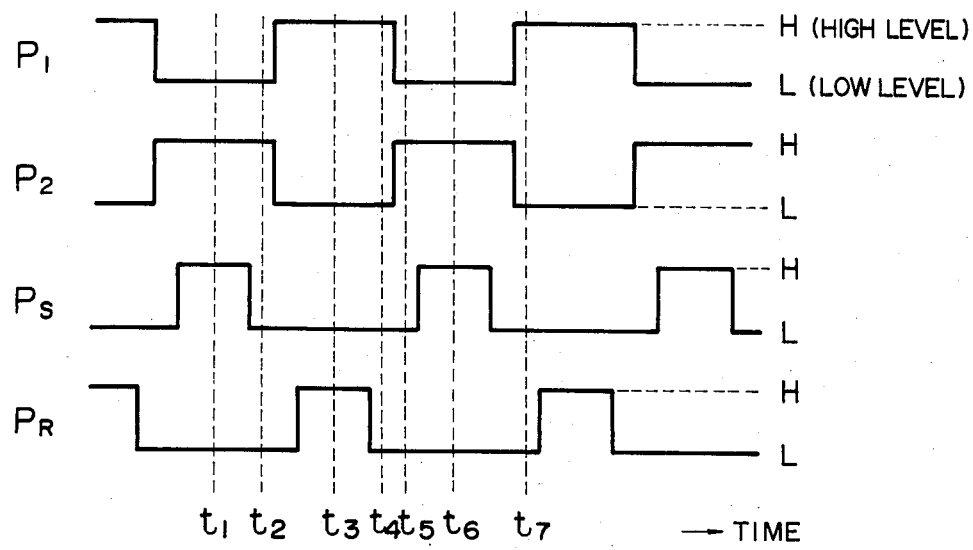
FIG. 2 is a waveform chart showing the waveforms of pulse signals for driving a CCD.
Figure 5:
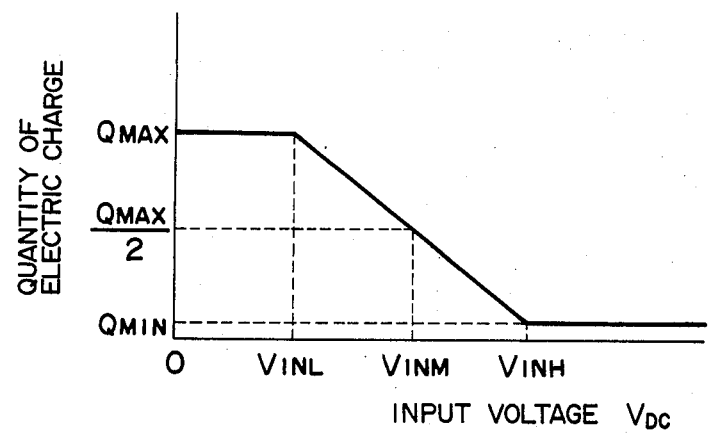
FIG. 5 is a graph showing the characteristic of an input part of a CCD.
Figure 3:
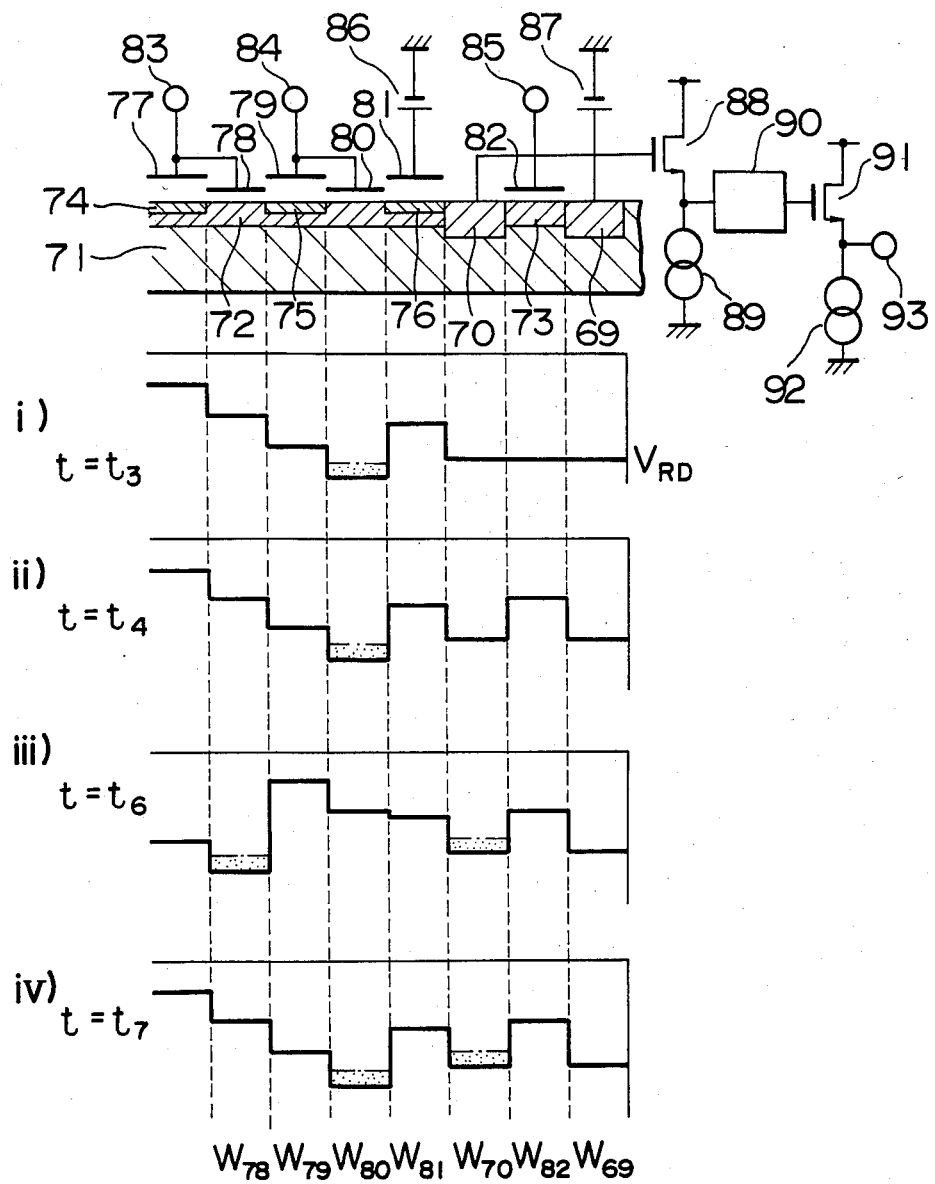
FIG. 3 shows the cross section of an output part of a CCD and the inner potential distribution in the output part at an operation period.
Figure 4A:
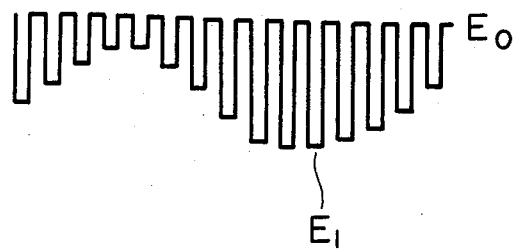
FIGS. 4A to 4C are waveform charts showing output waveforms from the CCD of FIG. 3.
Figure 4B:
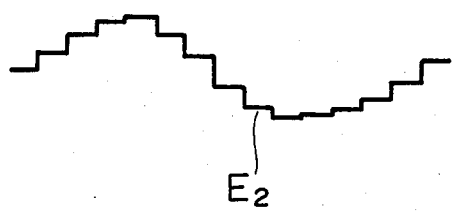
Figure 4C:
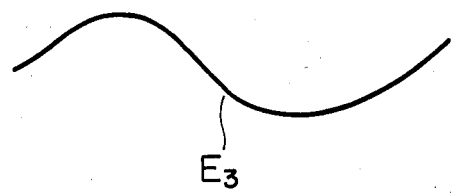
Figure 6:
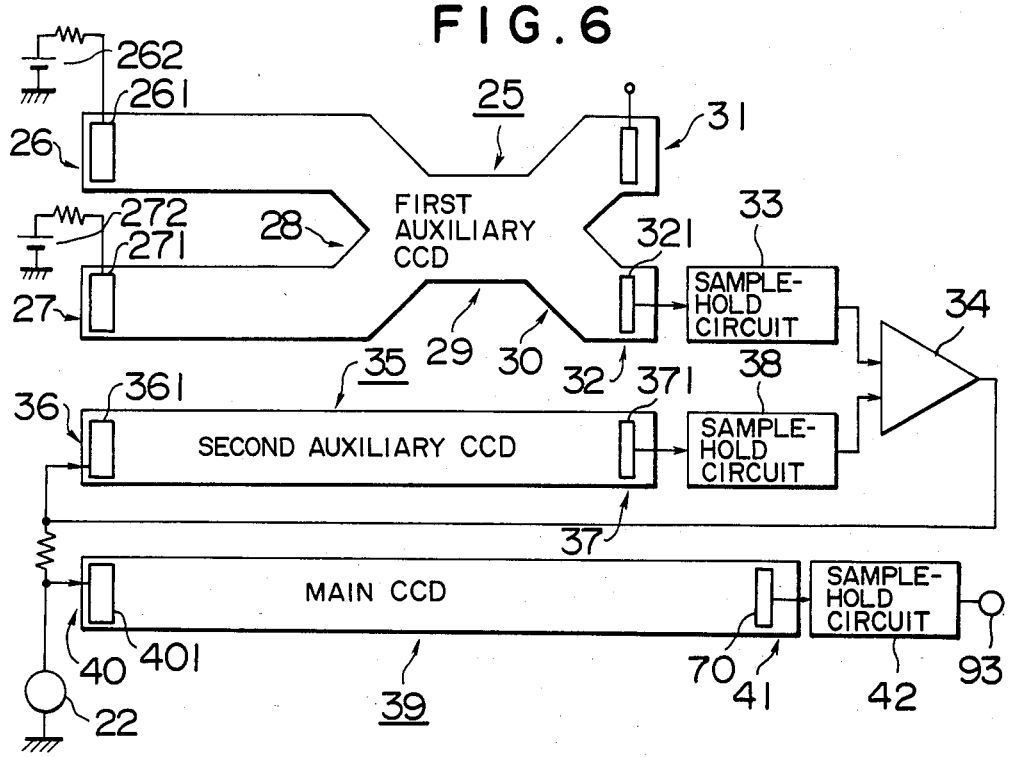
FIG. 6 is a block diagram showing a first embodiment of a CCD according to the present invention.

FIG. 6 is a block diagram showing a first embodiment of a CCD according to the present invention. Referring to FIG. 6, the present embodiment is made up of a first auxiliary CCD 25, a second auxiliary CCD 35, a main CCD 39 for delaying a signal, sample-hold circuits 33, 38 and 42, and a comparator 34. In FIG. 6, gate electrodes in each CCD are omitted for brevity's sake. The first auxiliary CCD 25 has a first input part 26, a second input part 27, a division part 30, and output parts 31 and 32. The output part 32 of the first auxiliary CCD 25, an output part 37 of the second auxiliary CCD 35, and an output part 41 of the main CCD 39 have substantially the same structure. These output parts 32, 37 and 41 are substantially equal in characteristics, for example, in electric charge-voltage conversion characteristic to each other. Further, the sample-hold circuits 33, 38 and 42 have substantially the same characteristics.

The output voltage of a bias voltage source 262 connected to an input electrode 261 of the first input part 26 is set so that the maximum transferable electric charge $Q_{MAX}$ can be inputted to the first input part 26, and the output voltage of a bias voltage source 272 connected to an input electrode 271 of the second input part 27 is set so that the electric charge supplied to the second input part 27 is equal to $Q_{MIN(\approx zero)}$. The electric charge injected into the first input part 26 and that injected into the second input part 27 are transferred to an addition part 28 having a common potential well, to be summed up therein. The summed-up charge is transferred through a transfer part 29 which has a large channel width so as not to cause the transferred charge to overflow, and then halved by a division part 30. Thus, an electric charge equal to $Q_{MAX}/2$ is transferred to each of the output parts 31 and 32. The charge transferred to the output part 32 is converted by an output electrode 321 into a voltage, which is applied to the sample-hold circuit 33 to obtain a D.C. voltage corresponding to an electric charge of $Q_{MAX}/2$. Means for summing up electric charges and means for dividing an electric charge into two equal parts are described in U.S. Pat. No. 4,217,605.

The output voltage $V_{INM}$ of the sample-hold circuit 33 is applied to the comparator 34, to be compared with an output voltage $V_X$ of the sample-hold circuit 38 which is connected to an output electrode 371 of the output part 37 of the second auxiliary CCD 35. The bias voltage applied to an input electrode 361 of an input part 36 of the second auxiliary CCD 35 varies so that the output voltage $V_X$ of the sample-hold circuit 38 becomes equal to the output voltage $V_{INM}$ of the sample-hold circuit 33. That is, the output signal of the sample-hold circuit 33 is used as a reference voltage in comparison, and a detection signal from the comparator 34 is used for controlling the bias voltage applied to the input electrode 361.

Thus, the bias voltage $V_{DC}$ for the input part 36 of the second auxiliary CCD 35 is varied so that the potential difference $(\phi_R - V_{DC})$ becomes equal to the center value $V_{INM}$ of the dynamic range. The bias voltage $V_{DC}$ thus obtained is also used as the bias voltage applied to an input electrode 401 of an input part 40 of the main CCD 39. Accordingly, the bias voltage for the main CCD 39 can be set to an optimum value without necessitating any external adjustment.

As mentioned above, the bias voltage applied to the main CCD is obtained on the basis of feed-back control. Accordingly, an optimum bias voltage is obtained without being affected by external disturbances such as temperature variation and aging.

Figure 7:
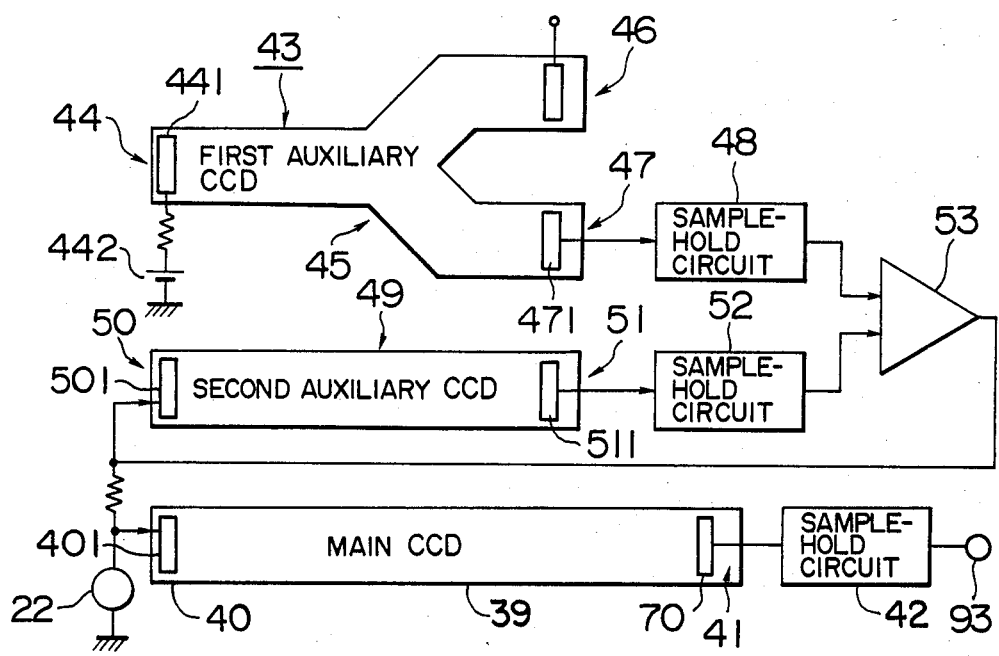
FIG. 7 is a block diagram showing a second embodiment of a CCD according to the present invention.

FIG. 7 is a block diagram showing a second embodiment of a CCD according to the present invention. Referring to FIG. 7, an output part 47 of a first auxiliary CCD 43, an output part 51 of a second auxiliary CCD 49 and the output part 41 of the main CCD 39 have substantially the same characteristics and sample-hold circuits 48, 52 and 42 have substantially the same characteristics, as in the first embodiment of FIG. 6.

The output voltage of a bias voltage source 442 connected to an input electrode 441 of an input part 44 of the first auxiliary CCD 43 is set so that the maximum transferable electric charge $Q_{MAX}$ is inputted to the input part 44. The electric charge transferred from the input part 44 is halved by a division part 45, and an electric charge equal to $Q_{MAX}/2$ is converted by an output electrode 511 into a voltage, which is applied to the sample-hold circuit 48. The circuit 48 generates an output voltage $V_{INM}$ which corresponds to an electric charge of $Q_{MAX}/2$ and indicates the center value of the dynamic range of the main CCD 39. The output voltage of the sample-hold circuit 48 is applied to a comparator 53, to be used as a reference voltage. The bias voltage applied to an input electrode 501 of an input part 50 of the second auxiliary CCD 49 is controlled so that the output voltage of the sample-hold circuit 52 connected to an output electrode 511 of the output part 51 of the second auxiliary CCD 49 becomes equal to the reference voltage. The bias voltage $V_{DC}$ thus obtained is also used as the bias voltage for the main CCD 39, to apply an optimum bias voltage to the input electrode 401 of the input part 40 of the main CCD 39.

Figure 8:
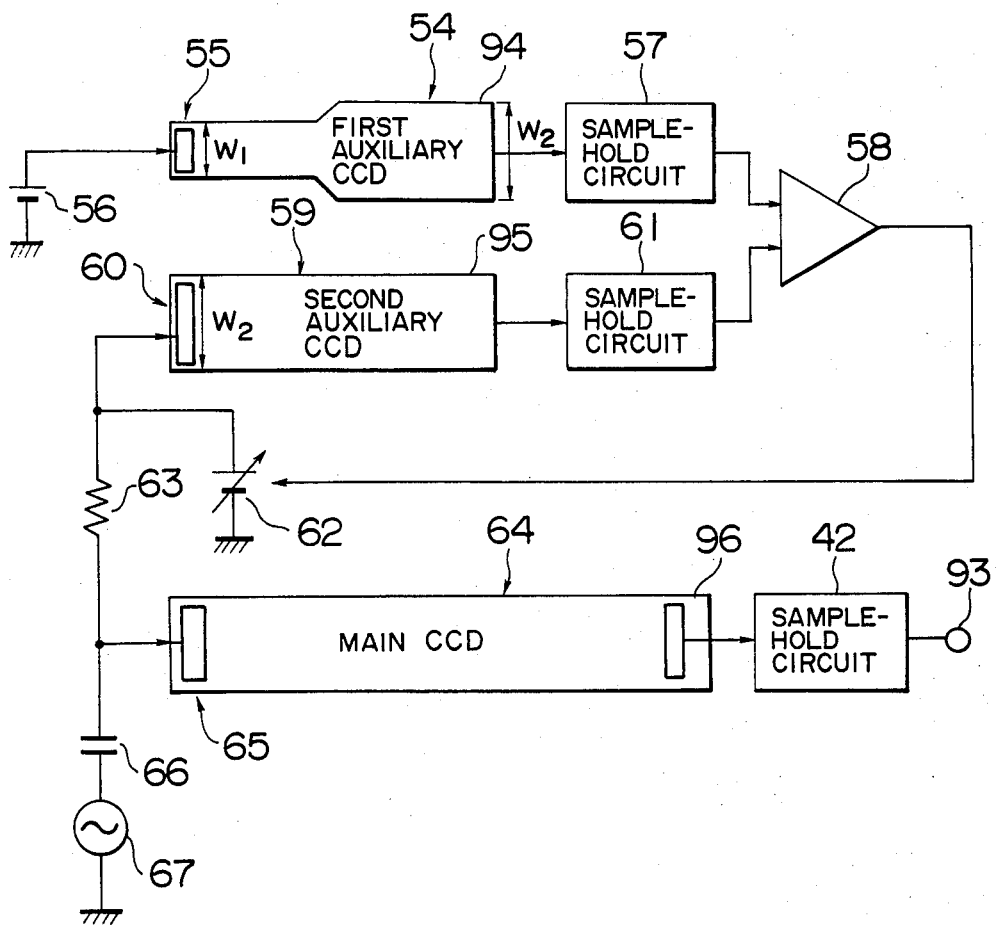
FIG. 8 is a block diagram showing a third embodiment of a CCD according to the present invention.

FIG. 8 is a block diagram showing a third embodiment of a CCD according to the present invention. Referring to FIG. 8, an output part 94 of a first auxiliary CCD 54, an output part 95 of a second auxiliary CCD 59 and an output part 96 of a main CCD 64 have substantially the same characteristics and sample-hold circuits 57, 61 and 42 have substantially the same characteristics, as in the first and second embodiments.

A channel width $w_1$ at an input part 55 of the first auxiliary CCD 54 is made substantially equal to one-half a channel width $w_2$ at input and transfer parts of each of the main CCD 64 and second auxiliary CCD 59, and the output voltage of a bias voltage source 56 connected to the input part 55 is selected so that a maximum transferable electric charge is inputted to the input part 55. The channel width at the output part 94 is made equal to $w_2$. Thus, an electric charge equal to $Q_{MAX}/2$, that is, an electric charge corresponding to the center value of the dynamic range of the main CCD 64 is inputted to the input part 55. The output voltage of the sample-hold circuit 57 which is connected to the first auxiliary CCD 54, is applied to a comparator 58, to be used as a reference voltage, and the output voltage of the sample-hold circuit 61 which is connected to the second auxiliary CCD 59, is compared with the reference voltage by the comparator 58. The output voltage of a voltage source 62 is controlled by the output voltage of the comparator 58 so that the output voltage of the sample-hold circuit 61 becomes equal to the reference voltage. Thus, the output voltage of the voltage source 62 is set to the center value of the dynamic range, and used as the bias voltage for an input part 60 of the second auxiliary CCD 59. The output voltage of the voltage source 62 is also applied to an input part 65 of the main CCD 64 through a resistor 63. As a result, an optimum bias voltage is always superposed on a signal which is supplied from a signal source 67 to the main CCD 64 through a coupling capacitor 66.

Figure 9:
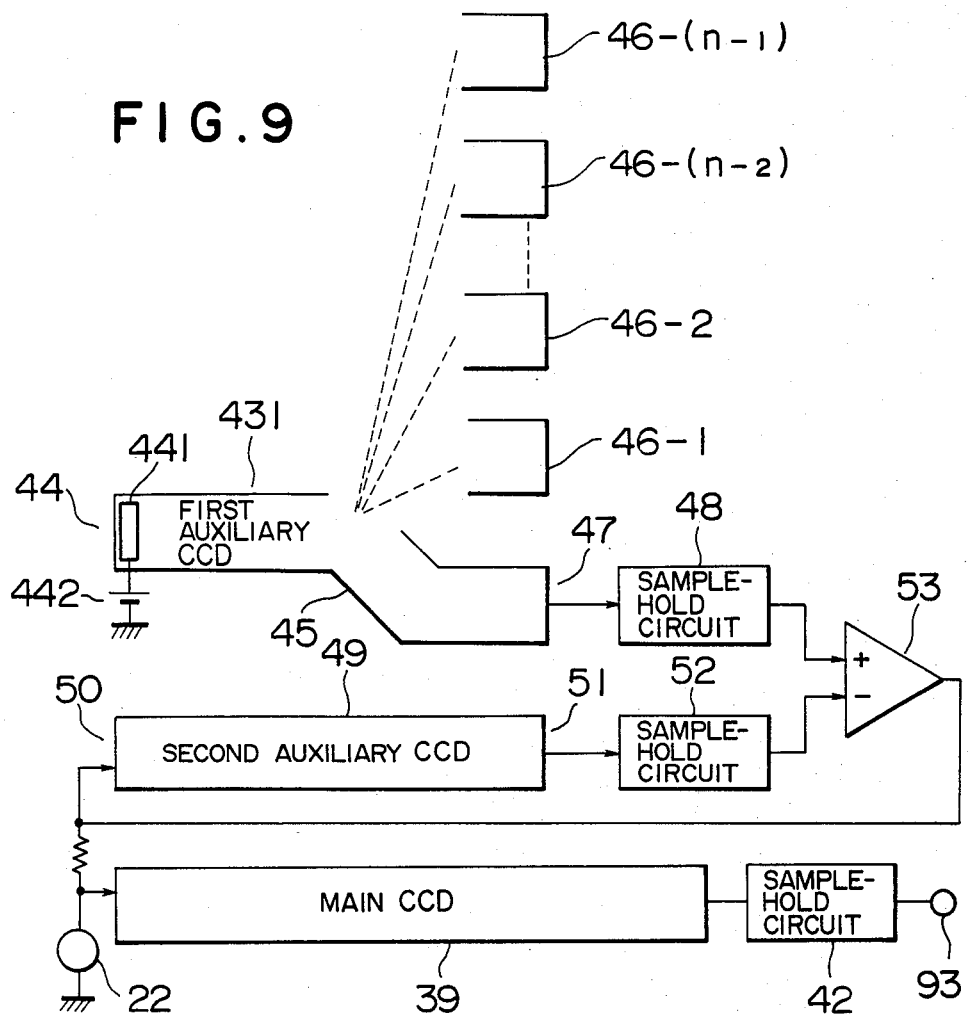
FIG. 9 is a block diagram showing a fourth embodiment of a CCD according to the present invention.
Figure 10:
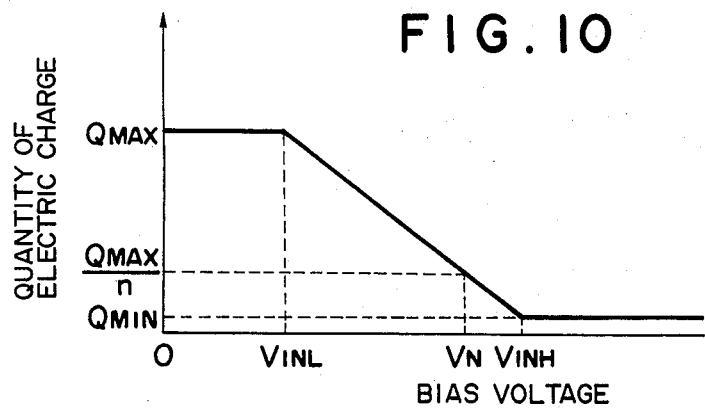
FIG. 10 is a graph showing a relationship between bias voltage and injected electric charge.

FIG. 9 shows a fourth embodiment of a CCD according to the present invention. The present embodiment is identical with the second embodiment of FIG. 7, except that a first auxiliary CCD 431 has n output parts 46-1, 46-2,—, 46-(n-2), 46-(n-1), and 47, where n is greater than 1 (one). As can be seen from FIG. 10 which shows a relationship between bias voltage and injected electric charge, a voltage $V_N$ corresponding to an electric charge of $Q_{MAX}/n$ is outputted from the sample-hold circuit 48. The bias voltage $V_{DC}$ applied to the second auxiliary CCD 49 and main CCD 39 is controlled so that the output voltage $V_X$ of the sample-hold circuit 52 becomes equal to the voltage $V_N$. The voltage $V_N$ varies with the parameter n. According to the present embodiment, the bias voltage applied to the main CCD is automatically set to a desired value by appropriately selecting the parameter n.

Figure 11:
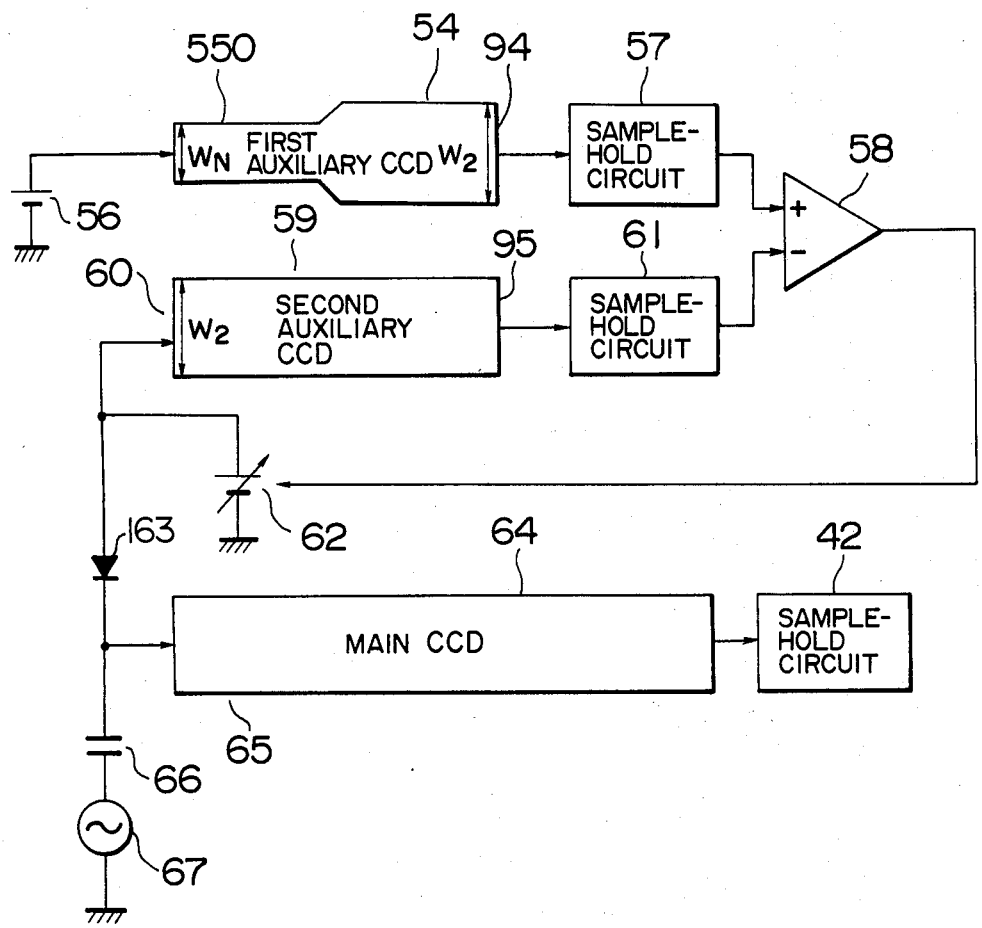
FIG. 11 is a block diagram showing a fifth embodiment of a CCD according to the present invention.

FIG. 11 shows a fifth embodiment of a CCD according to the present invention. Referring to FIG. 11, a channel width $w_N$ at an input part 550 of the first auxiliary CCD 54 is made equal to 1/n of the channel width $w_2$ at the second auxiliary CCD 59, where n is greater than 1 (one). Thus, the sample-hold circuit 57 connected to the output part 94 of the first auxiliary CCD 54 delivers an output voltage $V_N$ corresponding to an electric charge of $Q_{MAX}/n$, as in the fourth embodiment. The output voltage $V_{DC}$ of the voltage source 62 is controlled so that the output voltage $V_X$ of the sample-hold circuit 61 becomes equal to the output voltage $V_N$.

In the embodiment, the output voltage of $V_{DC}$ of the voltage source 62 is applied to the input 65 of the main CCD 64 through a clamp diode 163, so that signal which is applied from voltage source 67 can be varied from the $V_{DC}$ only in a positive direction.

In the case where a signal whose amplitude is varied from a predetermined D.C. level only in one direction, that is, in a positive or negative direction, is delayed by a CCD, the voltage $V_N$ should be set to a value approximately equal to the voltage $V_{INL}$ or $V_{INH}$.

Although five embodiments of a CCD according to the present invention have been explained in the foregoing, the present invention is not limited to these embodiments but is applicable to any CCD, without reference to a method of inputting a signal to the CCD, a method of taking out an output from the CCD, the structure of channel, or the waveform of driving pulse signal. The present invention is also applicable to a bucket brigade device (namely, BBD).

As has been explained in the foregoing, according to the present invention, the bias voltage applied to the imput part of a main CCD is automatically set to an optimum value. Accordingly, the main CCD can dispense with a bias-voltage adjusting operation which has hitherto been required. Moreover, the bias voltage is automatically kept at an optimum state even when ambient temperature varies.

What is claimed:

1. A bias voltage setting circuit for a main charge coupled device, said main charge coupled device including a first input electrode, a plurality of gate electrodes and a first output electrode, all of said first input electrode, gate electrodes and first output electrode being formed on a single semiconductor substrate, said first input electrode being applied with an A.C. signal and a first D.C. bias voltage, each of said gate electrodes being applied with a pulse voltage, an electric charge not more than $Q_{MAX}$ being transferred from said first input electrode to said first output electrode through a channel formed under said gate electrodes, said first output electrode generating a signal voltage corresponding to the transferred electric charge, said bias voltage setting circuit comprising:

(a) a first auxiliary charge coupled device including a second input electrode and a second output electrode each formed on said semiconductor substrate, said second input electrode being applied with a second D.C. bias voltage, an electric charge equal to $Q_{MAX}/n$ being detected by said second output electrode, where n is greater than one, said first auxiliary charge coupled device generating a first output voltage corresponding to said electric charge equal to $Q_{MAX}/n$;

(b) a first sample-hold circuit connected to said first auxiliary charge coupled device and applied with said first output voltage from said first auxiliary charge coupled device, for sampling and holding said first output voltage to generate a D.C. voltage $V_N$;

(c) a second auxiliary charge coupled device including a third input electrode and a third output electrode each formed on said semiconductor substrate, said third input electrode being applied with a third D.C. bias voltage, said third output electrode generating a second output voltage in accordance with said third D.C. bias voltage;

(d) a second sample-hold circuit connected to said second auxiliary charge coupled device and applied with said second output voltage from said second auxiliary charge coupled device, for sampling and holding said second output voltage to generate a D.C. voltage $V_X$;

(e) a comparison circuit connected to said first and second sample-hold circuits and applied with said D.C. voltage $V_N$ from said first sample-hold circuit and said D.C. voltage $V_X$ from said second sample-hold circuit, for comparing said D.C. voltage $V_X$ with said D.C. voltage $V_N$ to generate a detection signal when said D.C. voltage $V_X$ is different from said D.C. voltage $V_N$, said detection signal being supplied to said second auxiliary charge coupled device, to vary said third D.C. bias voltage so that said D.C. voltage $V_X$ becomes substantially equal to said D.C. voltage $V_N$; and (f) bias-voltage supply means connected between said third input electrode of said second auxiliary charge coupled device and said first input electrode of said main charge coupled device for supplying said third D.C. bias voltage of said third input electrode to said main charge couple device to use said third D.C. bias voltage as said first D.C. bias voltage of said first input electrode.

2. A bias voltage setting circuit according to claim 1, wherein n is equal to two.

3. A bias voltage setting circuit according to claim 1, wherein said second D.C. bias voltage applied to said second input electrode of said first auxiliary charge coupled device is selected so that an electric charge equal to $Q_{MAX}$ can be transferred from said second input electrode, and said first auxiliary charge coupled device includes means for dividing said electric charge equal to $Q_{MAX}$ into n equal parts where n is greater than one.

4. A bias voltage setting circuit according to claim 3, wherein n is equal to two.

5. A bias voltage setting circuit according to claim 1, wherein the width $W_N$ of a first channel which is formed under said second input electrode of said first auxiliary charge conpled device, is equal to 1/n of the width $W_2$ of a second channel which is formed under said third input electrode of said second auxiliary charge coupled device where n is greater than one.

6. A bias voltage setting circuit according to claim 5, wherein n is equal to two.

* * * * *